United States Patent
Deimling

[19]

[11] Patent Number: 5,814,991
[45] Date of Patent: Sep. 29, 1998

[54] MAGNETIC RESONANCE TOMOGRAPHY METHOD WITH SCREENING OF SIGNALS FROM TISSUES WITH LONG TRANSVERSE RELAXATION TIMES

[75] Inventor: Michael Deimling, Moehrendorf, Germany

[73] Assignee: Siemens Aktiengesellschaft, Munich, Germany

[21] Appl. No.: 843,267

[22] Filed: Apr. 14, 1997

[30] Foreign Application Priority Data

Apr. 24, 1996 [DE] Germany ................ 196 16 387.0

[51] Int. Cl.[6] .................... G01R 33/20; A61B 5/055
[52] U.S. Cl. ................................................. 324/309
[58] Field of Search ............................ 324/303, 300, 324/307, 309, 311, 312; 600/410

[56] References Cited

U.S. PATENT DOCUMENTS

| 5,229,717 | 7/1993 | Hinks. | |
|---|---|---|---|
| 5,545,990 | 8/1996 | Kiefer et al.. | |
| 5,561,369 | 10/1996 | Feinberg et al.. | |
| 5,617,029 | 4/1997 | Schneider | 324/320 |
| 5,680,043 | 10/1997 | Hurlimann et al. | 324/303 |

OTHER PUBLICATIONS

"Optimal Pulse Sequences For Magnetic Resonance Imaging–Computing Accurate T1, T2, And Proton Density Images," Iwaoka et al IEEE Trans. On Med. Imaging vol. MI–6, No. 4, Dec. 1987, pp. 360–639.

"High Signal Regions In Normal White Matter Shown By Heavily T2–Weighted CSF Nulled IR Sequences," Hajnal et al, J. of Computer Assisted Tomography, vol. 16, No. 4, Jul./Aug. 1992, pp. 506–513.

"Turbo–FLAIR Imaging of the Brain," Litt et al., Proceedings Of The SMR, 1994, San Francisco, p. 541.

*Primary Examiner*—Sandra L. O'Shea
*Assistant Examiner*—Michael Eisenberg
*Attorney, Agent, or Firm*—Hill & Simpson

[57] ABSTRACT

In a nuclear magnetic resonance tomography apparatus and a method in the form of a pulse sequence for operating the apparatus, after an excitation of spins in a subject, two groups of nuclear magnetic resonance signals are obtained in two time intervals at different chronological spacings from the excitation time. An image is obtained on the basis of the signal differences of nuclear magnetic resonance signals of the first and second groups with corresponding locus-encoding. Signal contributions from tissues with longer T2 relaxation time can thereby be screened out.

10 Claims, 6 Drawing Sheets

MAGNETIC RESONANCE TOMOGRAPHY METHOD WITH SCREENING OF SIGNALS FROM TISSUES WITH LONG TRANSVERSE RELAXATION TIMES

BACKGROUND OF THE INVENTION

1. Field of the Invention

The present invention is directed to a method for operating a nuclear magnetic resonance tomography apparatus.

2. Description of the Prior Art

For the recognition of sites of pathology (lesions), T2-weighted sequences in nuclear magnetic resonance tomography are particularly informative. In the region of the brain, however, the use of conventional T2-weighted sequences is limited by the fact that the signal from the gray and white brain matter decays significantly faster than the signal from the CSF (cerebrospinal fluid). In conventional T2-weighted images, CSF thus exhibits a significantly higher signal than the rest of the brain region. It is generally known that partial volume effects arise due to the limited spatial resolution in nuclear magnetic resonance tomography; i.e. a region with higher signal intensity in a pixel covers or masks the rest of the pixel region. This has the effect e.g. that small pathological sites located in the vicinity of the brain's ventricular system, or in the fluid chambers, are not recognized. In addition, the diagnostic value is reduced due to the fact that the CSF itself pulses, thus producing pulsation artefacts.

In order to circumvent these problems, in the article J. V. Hajnal et al., "High Signal Regions in Normal White Matter Shown by Heavily T2-Weighted CSF Nulled IR Sequences," Journal of Computer-Assisted Tomography, 16(4), pp. 506–513, July/August, it was proposed to use an inversion recovery sequence, whereby the inversion time is selected so that the CSF signal contribution is "nulled" (attenuated or suppressed). In order to achieve a strong T2-weighting for the remaining signal, long echo times are also used. By means of long inversion times and repetition times, measurement times thereby result that are typically longer than 12 minutes.

In order to shorten the measurement time, in the article A. W. Lift et al., "Turbo-FLAIR Imaging of the Brain," Proceedings of the SMR, 1994, San Francisco, p. 541, it was proposed to conduct a readout sequence according to the turbo spin echo method after inversion pulses radiated successively to all slices. A long inversion time, however, is also hereby required in this approach, so that the overall measurement time remains relatively long.

SUMMARY OF THE INVENTION

An object of the present invention is to provide a method for operating a magnetic resonance imaging apparatus in the form of a pulse sequence, and an arrangement for implementing this pulse sequence, in which the measurement time can be shortened in comparison to known methods as described above.

The above object is achieved in accordance with the principles of the present invention in a method for operating a nuclear magnetic resonance tomography apparatus, in the form of a pulse sequence, as well as a nuclear magnetic resonance tomography apparatus for implementing the method, wherein, after an excitation of spins in subject under transverse magnetization that decays with respective first and second T2 time constants, the second T2 time constant being longer than the first T2 time constant, two groups of locus-encoded nuclear magnetic resonance signals are obtained. The first group of nuclear magnetic resonance signals is obtained shortly after the excitation, and the second of nuclear magnetic resonance signals is obtained after the first group, in a time interval at which the longer, second T2 time constant supplies the predominant signal contribution. An image is then reconstructed on the basis of differences between the information contained in the locus-encoded nuclear magnetic resonance signals of the first and second groups.

The reconstructed image can be obtained, for example, by subtracting one group of signals from the other, with each group of signals, for example, being Fourier-transformed in a spatially allocated manner prior to the subtraction.

DESCRIPTION OF THE PREFERRED EMBODIMENTS

FIGS. 1a and 1b show the typical curve of the longitudinal magnetization and transverse magnetization in the known FLAIR sequence. The desired screening out of the CSF signals in the image is based on the clear differences in the T1 time of white matter, gray matter and CSF in the brain. Typical values for the longitudinal relaxation time T1, the transverse relaxation time T2 (each in ms) at field strength 1.5 T, and the density $\rho$ of the observed protons are shown in the following table:

|              | T1   | T2   | $\rho$ |
|--------------|------|------|--------|
| white matter | 800  | 80   | 80     |
| gray matter  | 1300 | 100  | 100    |
| CSF          | 3000 | 2000 | 100    |

FIG. 1a shows the curve of the longitudinal magnetization in percent values after an inversion pulse for white matter (W), gray matter (G) and CSF. After the inversion time TI, there follows at time TA an excitation of the nuclear spins, so that, as shown FIG. 1b, a transverse magnetization arises, insofar as a longitudinal magnetization was previously available for excitation. The inversion time TI is now dimensioned so that the longitudinal magnetization for CSF at the time of the excitation is exactly 0, so that CSF does not contribute to the signal. The inversion time TI is thereby determined according to the following formula. For TR=6000 ms, TI amounts e.g. to:

$TI \approx -T1(CSF) \cdot ln((1+exp(-TR/T1))/2) \approx 1700$ ms

Figure 1:
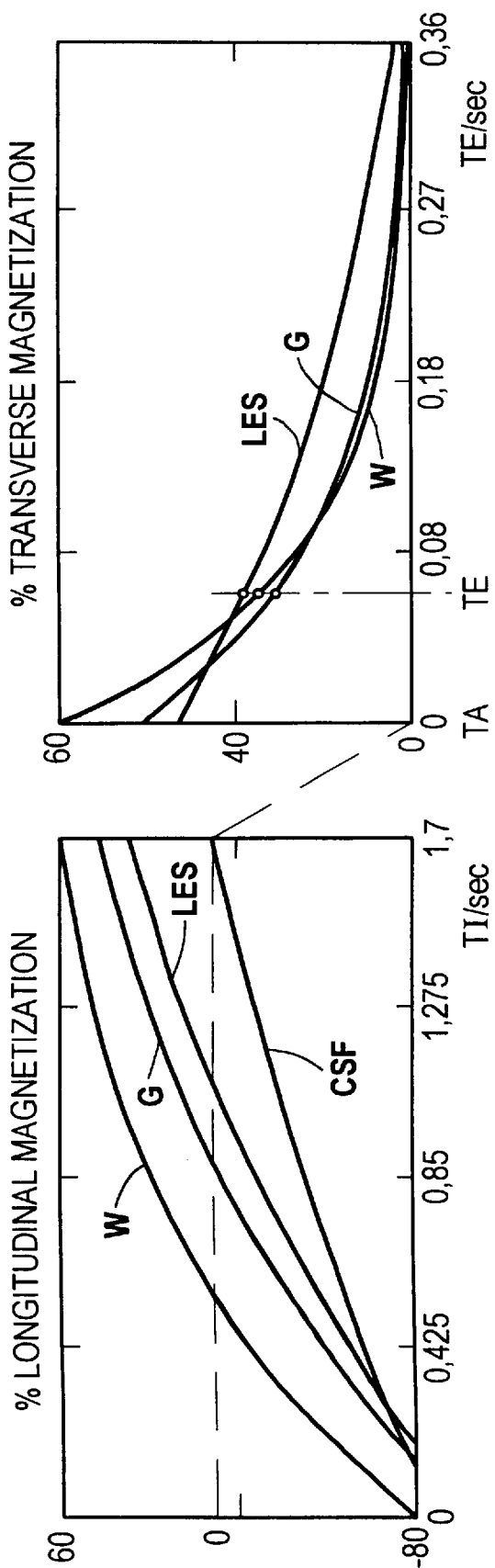
FIG. 1a shows the curve of the longitudinal magnetization and FIG. 1b shows the curve of the transverse magnetization, in the conventional FLAIR sequence, in order to illustrate the differences from the inventive method and apparatus.

With the excitation at time TA, a considerable longitudinal magnetization is thus available for the white and gray matter, which is converted into transverse magnetization by the excitation. The transverse magnetization decays with the time constant T2. At time TE, a nuclear magnetic resonance signal is read out. The echo time, i.e. the distance between the time TA of the excitation and the time TE of the occurring signal, is selected relatively long, at about 80 msec, in order to obtain a strong T2-weighting of the brain tissue. The T2-weighting is crucial, since it contributes substantially to the recognizability of lesions in the tissue. Lesions are distinguished from healthy tissue by longer T2 times. In FIG. 1, the curve of the transverse magnetization for lesions is designated LES. The disturbing signal from CSF is suppressed almost completely.

As was explained above, substantial measurement times result in the FLAIR sequence shown, due to the long inversion times TI and the long repetition times TR. The measurement time can be reduced by the application of the turbo spin echo technique in the readout phase, in which several echos with different phase encoding are measured after an excitation. The problem of the necessarily relatively long inversion time TI, however, still remains.

Figure 2:
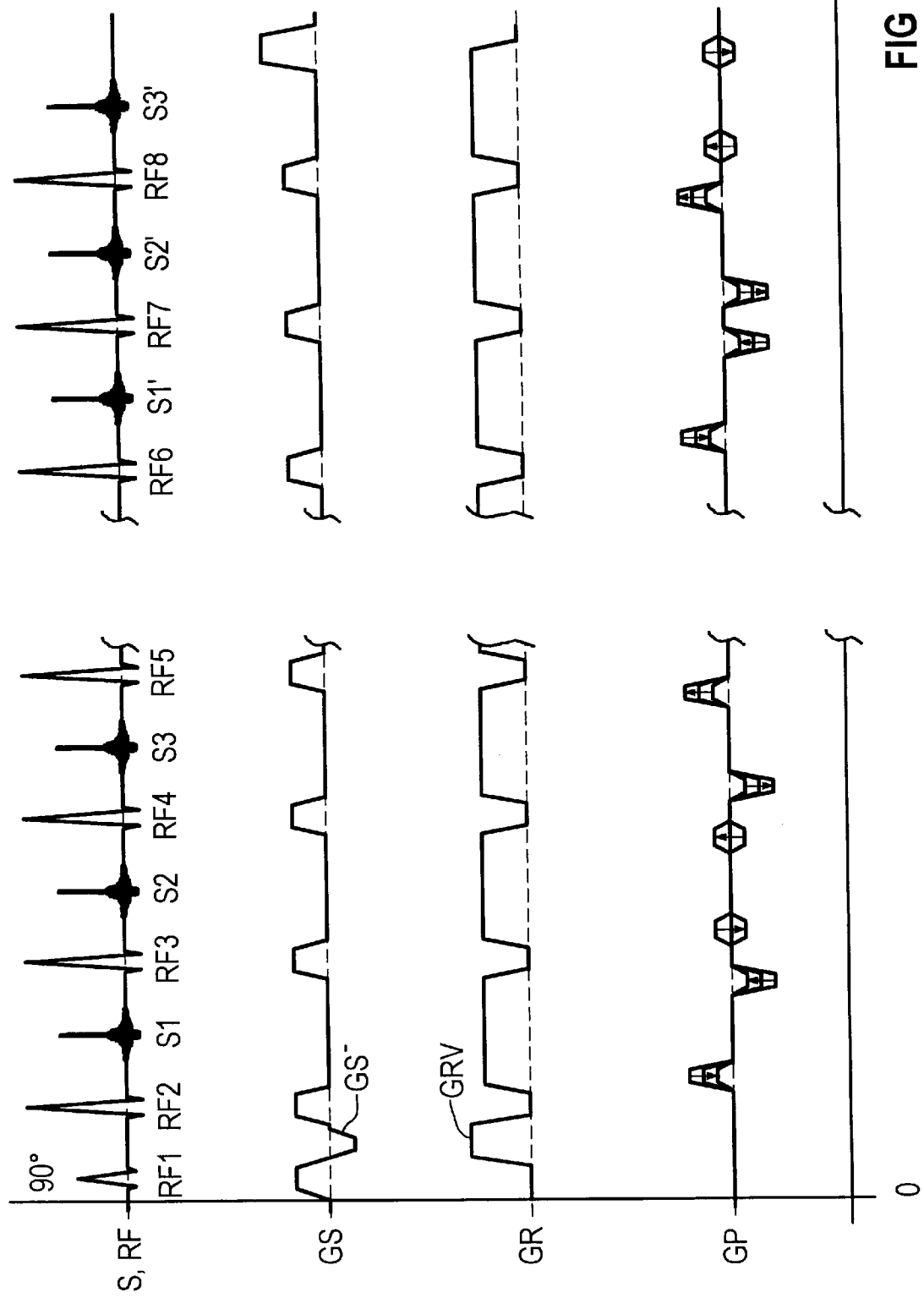
FIGS. 2 shows an example of a pulse sequence as a first exemplary embodiment of the invention.

The present invention thus departs from the inversion recovery process, and uses a sequence type according to the saturation recovery method. The sequence described herein can be referred to with the acronym "HIRE" (High Intensity Reduction Sequence). FIG. 2 shows an exemplary embodiment of such a sequence. A 90° radio-frequency pulse RF1 is first emitted, which is slice-selective under the effect of a slice selection gradient GS. The dephasing caused by the slice selection gradient GS is subsequently rephased by a negative gradient pulse GS-, and a prephasing gradient pulse GRV is activated in the readout direction. There subsequently follows a number of 180° radio-frequency pulses RF2 to RF4, which respectively act in slice-selective fashion, again under the effect of simultaneously activated slice selection gradients GS. After each radio-frequency pulse RF, spin echo signals S1 to S3, acquired under a readout gradient GR, arise in a known way. Frequency encoding is produced in the direction of the readout gradient GR. For phase encoding in a direction perpendicular thereto, a phase encoding gradient GP with an amplitude-time product is activated before each nuclear magnetic resonance signal S1 to S3, with the effect of the respective phase encoding gradient being reset after each spin echo signal S1 to S3 by means of an opposed gradient, i.e., a gradient having the same amplitude-time product as the gradient GP, but an opposite polarity (sign). At a later time after the 90° excitation, further spin echo signals S1' to S3' are obtained by means of emission of further radio-frequency pulses RF6 to RF8. These spin echo signals are likewise again frequency-encoded by means of a readout gradient GR and are phase-encoded by means of a phase encoding gradient GP. There can be a chronological spacing of several clock pulses of the radio-frequency pulses RF between the last read-out spin echo signal S3 of the first group and the first read-out spin echo signal S1' of the second group, as indicated in FIG. 2 by the interrupted diagram. It is thereby useful to let the radio-frequency pulses RF and the gradients GS and GR pass through in the same clock pulse so that the self-adjusting equilibrium, e.g. with respect to the eddy currents, is not disturbed. After a repetition time TR, the represented sequence begins anew with a radio-frequency excitation pulse RF1.

Figure 3:
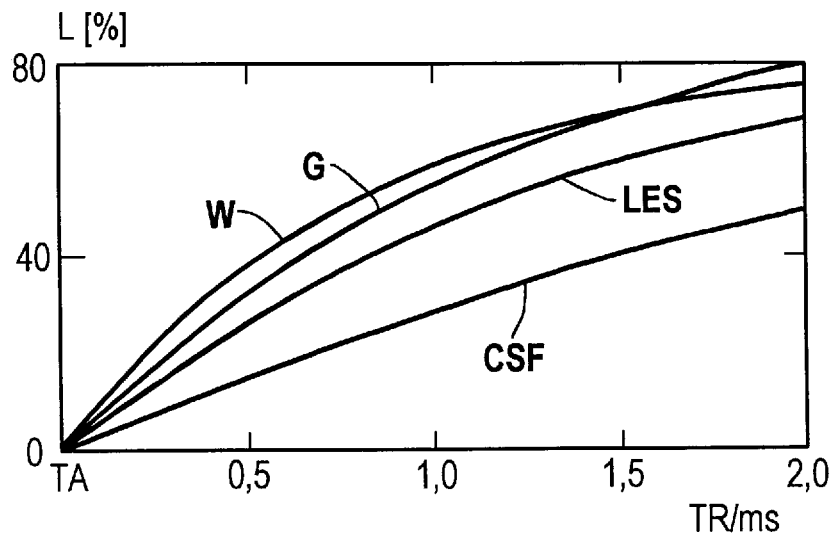
FIG. 3 shows the curve of the longitudinal magnetization and FIG. 4 a shows the curve of the transverse magnetization in the inventive pulse sequence.

The longitudinal magnetization L that arises in this sequence is shown in FIG. 3 for a repetition time TR of 2 sec for white matter W, gray matter G and CSF. At the excitation time TA, the longitudinal magnetization is equal to 0 for all tissue types under consideration, due to the excursion of the nuclear spins caused by the 90° pulse. With the different longitudinal relaxation time T1, the longitudinal magnetization increases again, whereby a value of about 50% is achieved for CSF, and for white and gray matter a value of about 75% and 78%, respectively.

Figure 4:
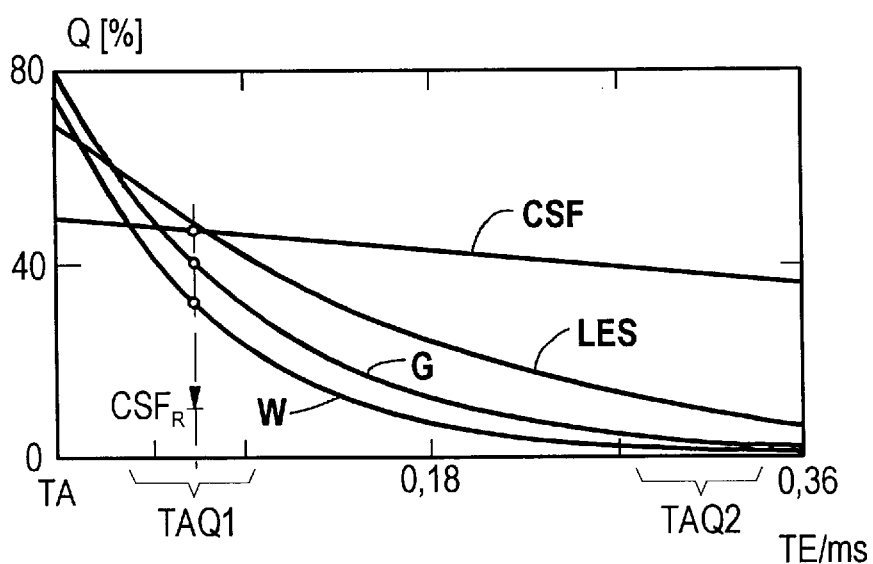

FIG. 4 shows the curve of the transverse magnetization Q in percent after an excitation at time TA for white matter W, gray matter G, CSF and lesions LSE. At the start, the transverse magnetization for white matter W, gray matter G and lesions LSE is fairly high, since correspondingly high longitudinal magnetization is available. In contrast, for CSF the transverse magnetization is lower, corresponding to the lower available longitudinal magnetization. For the white matter W, the gray matter G and the lesions LSE the transverse magnetization decays relatively quickly, while the transverse magnetization for CSF remains at a high level for a longer time.

An important aspect of the invention is the measurement of a first group of signals in a time interval TAQ1 that is relatively early after the time of excitation TA. This group of signals is, e.g., designated S1 to S3 in FIG. 2. As can be seen in FIG. 4, this group of signals S1 to S3 has a T2 contrast that enables a good differentiation of lesions LSE. The differentiation of white matter W and gray matter G is also significantly better than in the case of the FLAIR sequence shown in FIG. 1. At this time, however, CSF would still yield a high signal, so that the problems-explained above would still persist. This is avoided by acquiring a second group of spin echo signals in an acquisition phase TAQ2, in which the signal contribution from CSF is still high, but all other signal contributions are small. The signals of this second group of spin echo signals are designated S1' to S3' in the exemplary embodiment according to FIG. 2. The signals S1' to S3' are phase-encoded and frequency-encoded identically to the corresponding signals S1 to S3 of the first group. When the corresponding signals S1' to S3' of the second group are subtracted from the signals S1 to S3 of the first group, the CSF signal is reduced to a remainder, designated $CSF_R$ in FIG. 4.

Figure 5:
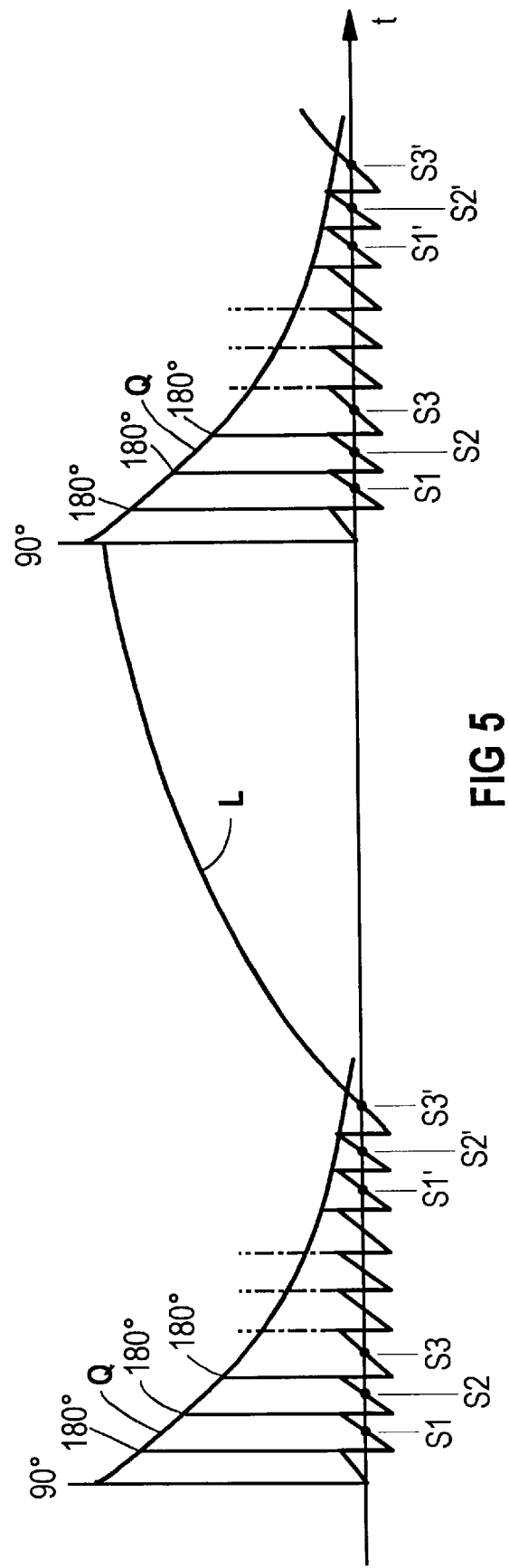
FIG. 5 shows the curve of the longitudinal magnetization and the transverse magnetization, together with the nuclear magnetic resonance signals, in accordance with the invention.

FIG. 5 again shows the chronological execution of the sequence in continuous fashion. Under each 90° pulse, the available longitudinal magnetization L is converted into a transverse magnetization Q, and thereby itself goes to 0. The transverse magnetization Q decays with the transversal relaxation time T2, while the longitudinal magnetization increases again with longitudinal relaxation time T1. Shortly after excitation, a first group of signals S1 to S3 is obtained, and at a later time a second group of signals S1' to S3' is obtained.

Figure 6:
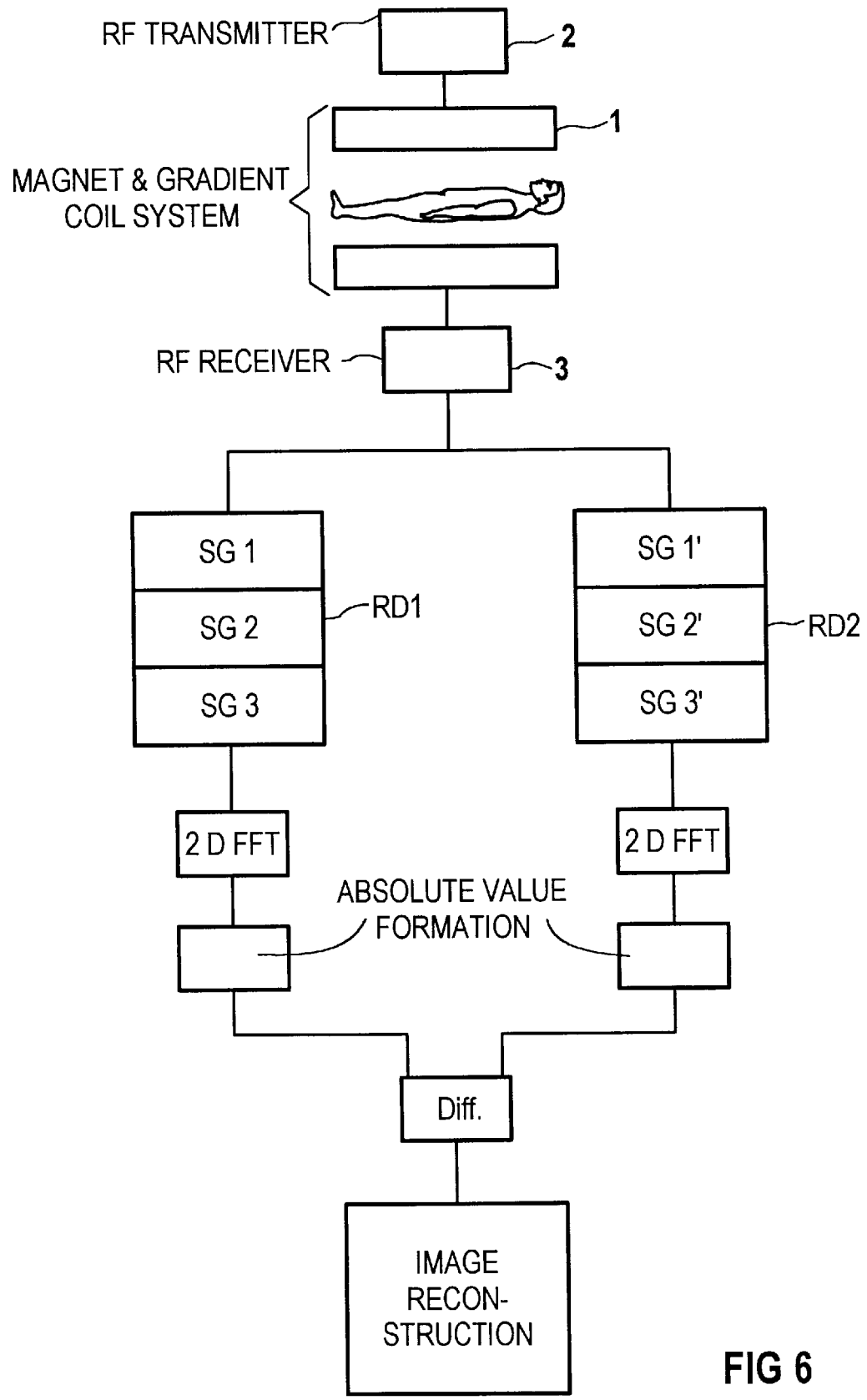
FIG. 6 shows a schematic flowchart for the inventive method.

FIG. 6 schematically illustrates the execution of the represented sequence, and also the components required. In a nuclear magnetic resonance tomography apparatus with a conventional magnet and gradient coil system 1, the radio-frequency pulses shown in FIG. 2 are emitted using a radio-frequency transmitter 2, and the nuclear magnetic resonance signals S1 to S3, S1' to S3' are received with a radio-frequency receiver 3. The nuclear magnetic resonance signals S1 to S3 of the first group are scanned and digitized, and the digital values are entered row by row into a first raw data matrix RD1. The signals S1' to S3' of the second group are processed in the same way and entered into a second raw data matrix RD2. Both raw data matrices RD1 and RD2 are subjected to a two-dimensional Fourier transformation, and absolute values are calculated from the complex values obtained in this way. Two matrices with absolute values are thereby obtained. All absolute values allocated to one another are subtracted from one another, and the difference is used as an image matrix. In principle, the subtraction could also be carried out in the raw data region or according to Fourier transformation before the formation of absolute values, however, phase errors would thereby have a stronger effect.

The raw data matrices used for image reconstruction typically have 256 or even 512 rows, in order to achieve a sufficient resolution. In the exemplary embodiment, however, only three signals are obtained per sequence repetition, i.e. three rows in each of the two raw data matrices RD1 and RD2. The sequence must thus be repeated correspondingly often with different phase encoding, until a sufficient number of signals have been obtained for completely filling the two raw data matrices RD1 and RD2. After a chronological allocation to the excitation pulse RF1, the signals S1 to S3 and S1' to S3' are entered into different segments SG1 to SG3 or, respectively, SG1' to SG3'. This technique is known as "segmented k-space."

For the image contrast, the middle Fourier rows, i.e. the segments SG2 or SG2', are decisive. In order to achieve a high T2 contrast, one can thus enter the signals S3 from each sequence into the segment SG2 of the raw data matrix RD1, and the signals S1 and S2 into the outer segments SG1 and SG3 of the raw data matrix RD1. Correspondingly, by entering the last signal S3' of the second group into the middle segment SG2' of the raw data matrix RD2, the signal dominated most strongly by the CSF is located in the most relevant segment.

A numerical example will serve to clarify the time and contrast relationships of this sequence. If the signal S3, which is entered into the middle segment SG2 of the raw data matrix RD1 and is thereby decisive for the image contrast, is read out with an echo time (i.e. a time between excitation and readout) of TE=80 msec, a relative signal value of $\exp(-TE/T2)=45\%$ is obtained for the gray matter G with T2=100 msec. The echo time TE for the last signal S3' of the second group should be chosen such that the magnetization of the brain tissue is still only a small percentage of the initial magnetization, e.g. about 3% for the gray matter with an echo time of 360 msec. The transverse magnetization of the CSF with a transverse relaxation time T2=2000 msec, however, still amounts to about 90%. By subtracting the CSF-dominated image from the last image, T2-weighted with an echo time of 80 msec, the CSF portion is reduced from 96% to 12%.

In the known FLAIR sequence, screening out of CSF is based on T1 effects, while in the method specified herein it is based on T2 effects. Since in nuclear magnetic resonance the longitudinal relaxation time T1 is always greater than or equal to the transversal relaxation time T2, the T2 method enables a shortening of measurement time.

In the known T1 method, artefacts can arise due to the flow of fluid into the slice under measurement, which appear as bright interference areas in the ventricle system. In the method presented herein, however, only the transverse magnetization is used, so that fluid flow causes no artefacts.

It is generally known that the signal-to-noise ratio in the saturation recovery sequence type. (the sequence specified herein being classifiable as this type, is higher than in an inversion recovery sequence, as exists e.g. in the FLAIR method.

As shown above on the basis of the diagrams, the differentiation between the gray matter G and white matter W in the brain tissue is greater here than in the FLAIR sequence.

Figure 7:
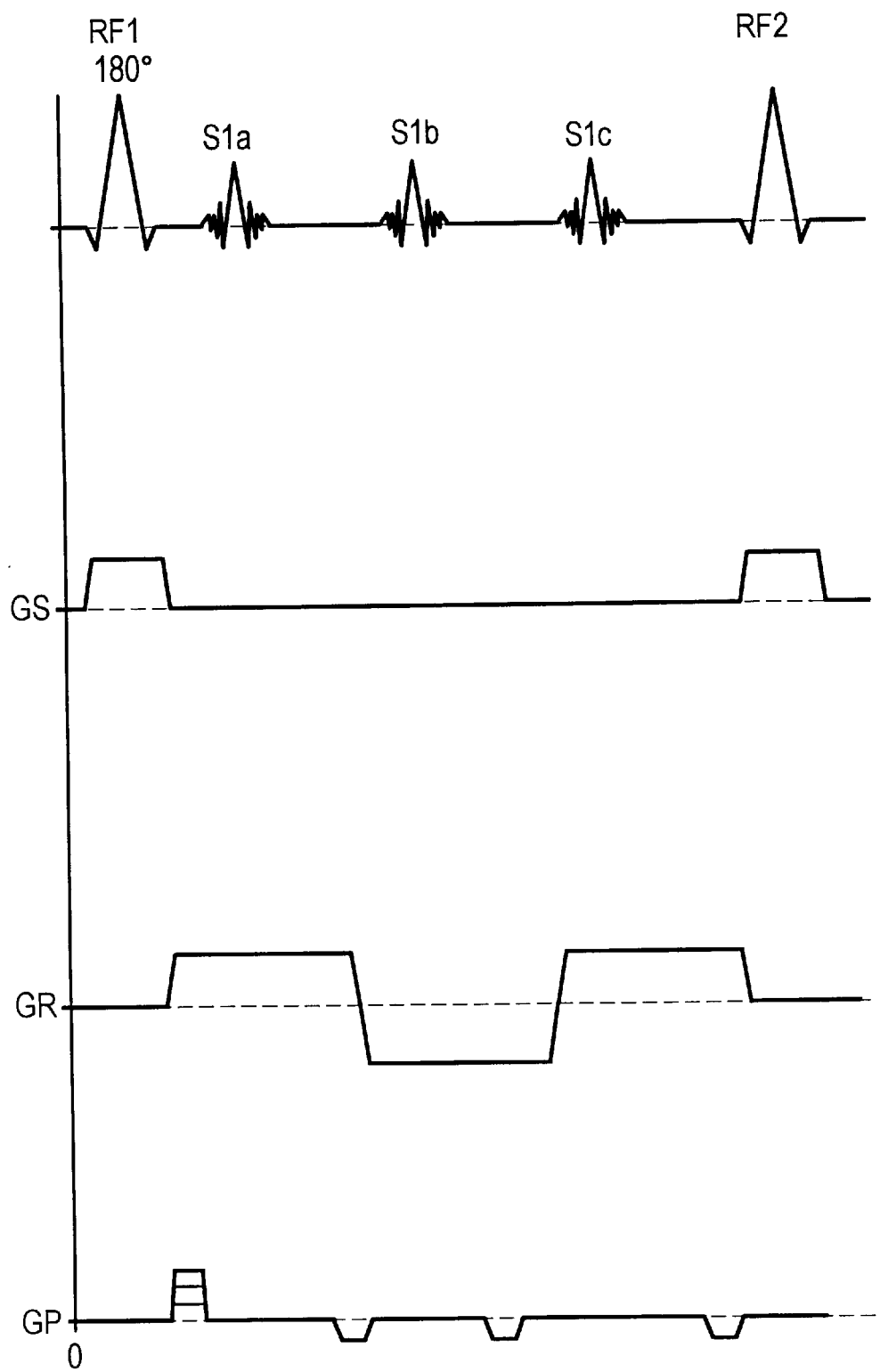
FIG. 7 shows an excerpt from a pulse sequence, as a further exemplary embodiment of the invention.

FIG. 7 shows a modification of the inventive sequence based on the so-called GRASE method, as described in WO 93/0 15 09. After each 180° radio-frequency pulse RF, several nuclear magnetic resonance signals are obtained; in the example shown these are three nuclear magnetic resonance signals S1a to S1c. This is achieved by multiply inverting the readout gradient GR. The individual signals S1a to S1c are differently phase-encoded, so that they occupy different rows of the raw data matrix. This results in the raw data matrix becoming filled more rapidly (three times as fast in the example shown), so that the measurement time is correspondingly shortened. It is thereby even possible to produce three-dimensional data sets with reasonable measurement times.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a nuclear magnetic resonance tomography apparatus for examining first tissue in an examination subject having a first T2 time, the subject also containing tissue having a second T2 time which is longer than said first T2 time, said method comprising the steps of:

exciting nuclear spins in each of said first and second tissues in said subject, beginning at an excitation time, under transverse magnetization which decays with said first and second T2 time constants, obtaining a first group and a second group of locus-encoded nuclear magnetic resonance signals from said subject;

obtaining said first group of nuclear magnetic resonance signals shortly after said excitation time;

obtaining said second group of nuclear magnetic resonance signals after said first group in a time interval following said excitation time at which said second tissue having said second time constant supplies a predominant signal contribution to the nuclear magnetic resonance signals; and reconstructing an image of said examination subject containing said first and second tissues on the basis of differences in the respective content of said first and second groups of locus-encoded nuclear magnetic resonance signals having identical locus encoding.

2. A method as claimed in claim 1 wherein the step of reconstructing an image includes digitizing each of said first and second groups of locus-encoded nuclear magnetic resonance signals, to obtain digitized first and second groups of signals, and forming a subtraction difference between said first and second digitized groups of signals having identical locus encoding.

3. A method as claimed in claim 1 wherein the step of reconstructing an image includes Fourier-transforming each of said first and second groups of locus-encoded nuclear magnetic resonance signals with spatial allocation, to obtain first and second Fourier-transformed groups of signals, and forming a subtraction difference between said first and second groups of Fourier-transformed signals having identical locus encoding.

4. A method as claimed in claim 1 wherein the step of reconstructing an image comprises Fourier-transforming each of said first and second groups of locus-encoded nuclear magnetic resonance signals to obtain first and second groups of Fourier-transformed signals, each of said first and second groups of Fourier-transformed signals having a real part and an imaginary part, forming respective absolute values of the real part and the imaginary part of each of the signals of said first and second groups of Fourier-transformed signals to obtain first and second groups of absolute values, and forming a subtraction difference between said first and second groups of absolute values of the same locus allocation.

5. A method as claimed in claim 1 wherein the steps of exciting nuclear spins and reading out said nuclear magnetic resonance signals comprise:

emitting a 90° radio-frequency pulse to said subject;

emitting a plurality of refocusing radio-frequency pulses to said subject; and reading out said first and second groups of locus-encoded nuclear magnetic resonance signals under respective read out gradients.

6. A method as claimed in claim 5 wherein the step of reading out said nuclear magnetic resonance signals includes multiply inverting at least one readout gradient after each refocusing radio-frequency pulse for obtaining a plurality of said nuclear magnetic resonance signals under the multiply inverted readout gradient.

7. A method as claimed in claim 1 comprising the step of locus-encoding said nuclear magnetic resonance signals by emitting a phase-encoding gradient with a first amplitude-time product before each nuclear magnetic resonance signal and emitting a phase-encoding gradient with an amplitude-time product having an opposite polarity after each nuclear magnetic resonance signal.

8. A method as claimed in claim 7 wherein said phase-encoding gradient produce respective phase factors for each of said nuclear magnetic resonance signals in said first and second groups of nuclear magnetic resonance signals, and said method comprising the additional steps of entering said first group of nuclear magnetic resonance signals into a first raw data matrix according to the respective phase factors of said nuclear magnetic resonance signals in said first group, entering said second group of nuclear magnetic resonance signals into a second raw data matrix according to the respective phase factors of the nuclear magnetic resonance signals in said second group, with only a portion of the nuclear magnetic resonance signals required for a complete filling of each raw data matrix being obtained for each excitation of spins, and repeating the steps of exciting nuclear spins and reading out said first and second groups of nuclear magnetic resonance signals until each raw data matrix is completely filled.

9. A method as claimed in claim 8 wherein each of said raw data matrices represent k-space values, and wherein the step of obtaining said second group of nuclear magnetic resonance signals comprises obtaining central k-space values for said second group of nuclear magnetic resonance signals at an end of reading out of said second group of nuclear magnetic resonance signals.

10. A nuclear magnetic resonance tomography apparatus for examining first tissue in an examination subject having a first T2 time, said subject also containing second tissue having a second T2 time which is longer than said first T2 time, said apparatus comprising:

transmission means for emitting a plurality of 90° radio-frequency excitation pulses for exciting nuclear spins in said examination subject, and for subsequently emitting a plurality of 180° refocusing radio-frequency pulses;

reception means for receiving a first group of nuclear magnetic resonance signals at a short chronological distance from a selected 90° radio-frequency pulse and for receiving a second group of nuclear magnetic resonance signals at a larger chronological distance from said selected 90° radio-frequency pulse;

a first memory for storing said first group of nuclear magnetic resonance signals and a second memory for said second group of nuclear magnetic resonance signals;

subtraction means for subtracting corresponding nuclear magnetic resonance signals in said first and second groups respectively stored in said first and second memories to obtain a difference; and image reconstruction means for reconstructing an image of said subject including said first and second tissues from said difference.

\* \* \* \* \*